US008922668B2

(12) United States Patent
Ota

(10) Patent No.: US 8,922,668 B2
(45) Date of Patent: Dec. 30, 2014

(54) SOLID-STATE IMAGE SENSING ELEMENT AND IMAGE SENSING SYSTEM INCLUDING COMPARISON UNITS WITH SWITCHABLE FREQUENCY BAND CHARACTERISTICS

(75) Inventor: Keisuke Ota, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 128 days.

(21) Appl. No.: 12/845,027

(22) Filed: Jul. 28, 2010

(65) Prior Publication Data

US 2011/0037868 A1   Feb. 17, 2011

(30) Foreign Application Priority Data

Aug. 13, 2009   (JP) .................................. 2009-187834

(51) Int. Cl.
| | | |
|---|---|---|
| *H04N 5/335* | (2011.01) | |
| *H04N 5/357* | (2011.01) | |
| *H04N 5/374* | (2011.01) | |
| *H04N 5/378* | (2011.01) | |
| *H03M 1/18* | (2006.01) | |
| *H03M 1/56* | (2006.01) | |
| *H03M 1/12* | (2006.01) | |

(52) U.S. Cl.
CPC ............. *H04N 5/357* (2013.01); *H04N 5/3742* (2013.01); *H03M 1/56* (2013.01); *H03M 1/123* (2013.01); *H04N 5/378* (2013.01); *H03M 1/188* (2013.01)
USPC ......... 348/222.1; 348/302; 348/303; 348/308

(58) Field of Classification Search
USPC ................. 348/303, 222.1; 341/155
See application file for complete search history.

(56) References Cited

U.S. PATENT DOCUMENTS

| | | | | |
|---|---|---|---|---|
| 5,801,657 | A * | 9/1998 | Fowler et al. ................. | 341/155 |
| 6,545,624 | B2 * | 4/2003 | Lee et al. ...................... | 341/155 |
| 6,621,445 | B1 * | 9/2003 | Thilenius ...................... | 341/172 |
| 2003/0076432 | A1 * | 4/2003 | Luo et al. ...................... | 348/308 |
| 2005/0088331 | A1 * | 4/2005 | Krymski ....................... | 341/169 |
| 2006/0208938 | A1 * | 9/2006 | Fiorenza et al. ............. | 341/172 |
| 2008/0136948 | A1 * | 6/2008 | Muramatsu ................... | 348/294 |
| 2008/0284626 | A1 | 11/2008 | Hattori ......................... | 341/133 |
| 2008/0291304 | A1 | 11/2008 | Ota et al. ...................... | 348/294 |
| 2009/0021621 | A1 | 1/2009 | Hashimoto et al. ........... | 348/300 |
| 2009/0066554 | A1 * | 3/2009 | Lim .............................. | 341/155 |

(Continued)

FOREIGN PATENT DOCUMENTS

| | | |
|---|---|---|
| JP | 62-154981 A | 7/1987 |
| JP | 2008-054256 A | 3/2008 |

(Continued)

*Primary Examiner* — Nicholas Giles
*Assistant Examiner* — Abdelaaziz Tissire
(74) *Attorney, Agent, or Firm* — Fitzpatrick, Cella, Harper & Scinto

(57) ABSTRACT

In a solid-state image sensing element which includes a pixel array portion in which a plurality of pixels each including a photoelectric converter are arranged two-dimensionally, and readout circuits which read out analog pixel signals from the pixel array portion by column, and in which each of the readout circuits includes an A/D conversion circuit which converts the analog pixel signal from the pixel array portion into a digital pixel signal, and the A/D conversion circuit performs A/D conversion by comparing, by a comparison unit, a signal level of the analog pixel signal from the pixel array portion with a temporally changing reference level, a frequency band characteristic of the comparison unit is switched in accordance with the signal level of the analog pixel signal from the pixel array portion.

5 Claims, 7 Drawing Sheets

(56) References Cited

U.S. PATENT DOCUMENTS

| | | | |
|---|---|---|---|
| 2009/0073274 A1* | 3/2009 | Dai | 348/222.1 |
| 2009/0159782 A1 | 6/2009 | Murakami et al. | 250/208.1 |
| 2009/0195431 A1* | 8/2009 | Snoeij et al. | 341/155 |
| 2009/0224829 A1* | 9/2009 | Johansson | 330/252 |
| 2009/0319211 A1* | 12/2009 | Bresch | 702/65 |
| 2009/0322903 A1 | 12/2009 | Hashimoto et al. | 348/229.1 |
| 2010/0259660 A1* | 10/2010 | Kukita | 348/308 |
| 2010/0265374 A1* | 10/2010 | Nishi | 348/302 |
| 2010/0271248 A1* | 10/2010 | Yamaoka et al. | 341/155 |
| 2011/0080512 A1* | 4/2011 | Ay | 348/308 |
| 2011/0095926 A1* | 4/2011 | Bogaerts | 341/155 |
| 2013/0070136 A1* | 3/2013 | Hiyama et al. | 348/300 |

FOREIGN PATENT DOCUMENTS

| | | |
|---|---|---|
| JP | 2008-312201 A | 12/2008 |
| JP | 2009-159069 A | 7/2009 |
| WO | WO 2009090703 A1 * | 7/2009 |

* cited by examiner

F I G. 1B
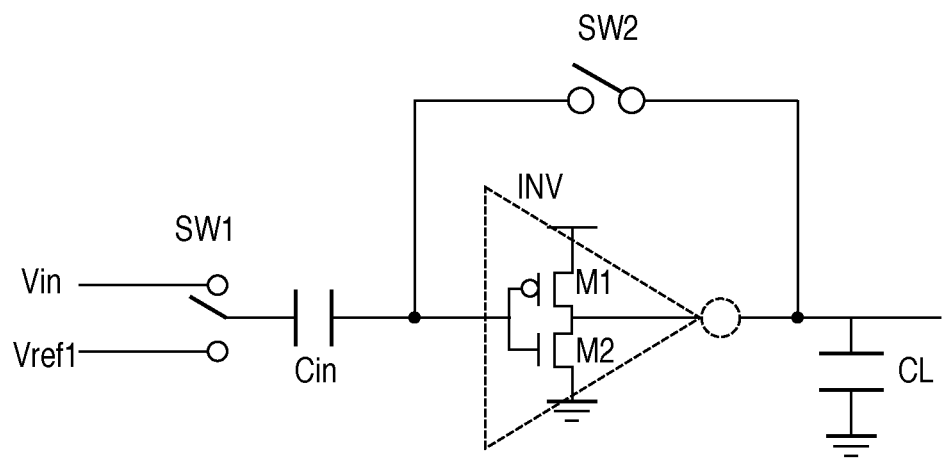

SOLID-STATE IMAGE SENSING ELEMENT AND IMAGE SENSING SYSTEM INCLUDING COMPARISON UNITS WITH SWITCHABLE FREQUENCY BAND CHARACTERISTICS

BACKGROUND OF THE INVENTION

1. Field of the Invention

The present invention relates to a solid-state image sensing element and image sensing system and, more particularly, to a solid-state image sensing element which includes column A/D conversion circuits that perform analog-to-digital conversion of pixel signals from two-dimensionally arranged pixels by column, and an image sensing system using the solid-state image sensing element.

2. Description of the Related Art

In recent years, X-Y addressing type solid-state image sensing elements, such as a CMOS sensors, have emerged which includes circuits that perform analog-to-digital conversion (to be referred to as A/D conversion hereinafter) by column. Such solid-state image sensing element converts analog signals from pixels into digital signals in an early stage of a signal path, thereby preventing noise from superimposing on signals, and improving an S/N. Also, A/D conversion processing can be executed in a column parallel manner, thus speeding up signal readout processing.

A plurality of types of column A/D conversion circuits have been proposed in terms of circuit scales, processing speeds, resolutions, and the like. One of these types is a single-slope integration type A/D conversion circuit which compares a pixel signal and a reference voltage that changes in the form of a ramp wave shape depending on counts, and acquires a count value upon completion of the comparison processing as a digital signal (Japanese Patent Laid-Open No. 62-154981). As a characteristic feature of the single-slope integration type A/D conversion circuit, since an A/D conversion circuit can be configured in a simple arrangement, an increase in circuit scale can be avoided even when circuits are arranged in parallel.

Japanese Patent Laid-Open No. 62-154981 above does not consider any noise generated by a comparison circuit included in the A/D conversion circuit. Although a relatively low conversion rate is required since A/D conversion is performed in a column-parallel manner, the comparison circuit actually requires a frequency band of several hundred MHz so as to meet readout the requirements for speed-up and multiple tones. In general, a wideband circuit suffers large noise. This is because such circuits undesirably transmit noise components distributed over a broad frequency band.

In case of a comparison circuit having a frequency band of several hundred MHz, when a circuit is actually designed, noise may have a magnitude as large as several hundred μV. For example, in case of a 12-bit A/D conversion circuit having an input range of 1 V, since the quantization error is 1 V/4096=244 μV, noise caused by the comparison circuit (to be referred to as circuit noise hereinafter) has a magnitude that cannot be ignored compared to the quantization error. In this case, even if the A/D conversion resolution is raised any further, circuit noise becomes dominant, and lower bits include only noise components. Therefore, a practical resolution as determined by the S/N ratio is as low as about 12 bits. In particular, when incoming light is weak, that is, when the signal output level is low, circuit noise imposes a relatively serious influence, thus requiring measures to be taken against it. On the other hand, when incoming light is strong, since light-shot noise becomes dominant, the influence of circuit noise is relatively small. In this case, the comparison circuit is required to meet other requirements such as speed-up rather than low-noise requirements. Therefore, it is difficult for the conventional arrangement to attain noise reduction while maintaining high A/D conversion speed.

SUMMARY OF THE INVENTION

The present invention has been made in consideration of the aforementioned problems, and switches a frequency band characteristic of a comparison unit in order to attain a noise reduction of a solid-state image sensing element including A/D conversion circuits by column and an image sensing system, while maintaining a high A/D conversion speed.

The present invention has been made in consideration of the aforementioned problems, and provides a solid-state image sensing element comprising a pixel array portion in which a plurality of pixels each including a photoelectric converter are arranged two-dimensionally, and readout circuits configured to read out analog pixel signals from the pixel array portion by column, each of the readout circuits including an A/D conversion circuit which converts the analog pixel signal from the pixel array portion into a digital pixel signal, the A/D conversion circuit performing A/D conversion by comparing, by a comparison unit, a signal level of the analog pixel signal from the pixel array portion with a temporally changing reference level. The solid-state image sensing element comprising: a control unit configured to switch a frequency band characteristic of the comparison unit in accordance with the signal level of the analog pixel signal from the pixel array portion.

The present invention also provides an image sensing system comprising: a solid-state image sensing element as mentioned above; and a signal processing unit configured to process a signal obtained by the solid-state image sensing element.

According to the solid-state image sensing element and image sensing system of the present invention, a noise reduction can be attained while maintaining a high A/D conversion speed.

Further features of the present invention will become apparent from the following description of exemplary embodiments with reference to the attached drawings.

BRIEF DESCRIPTION OF THE DRAWINGS

FIG. 1B is a circuit diagram showing an example of an equivalent circuit of comparison circuits COMPx1 and COMPx2 according to the first embodiment.

Figure 6:
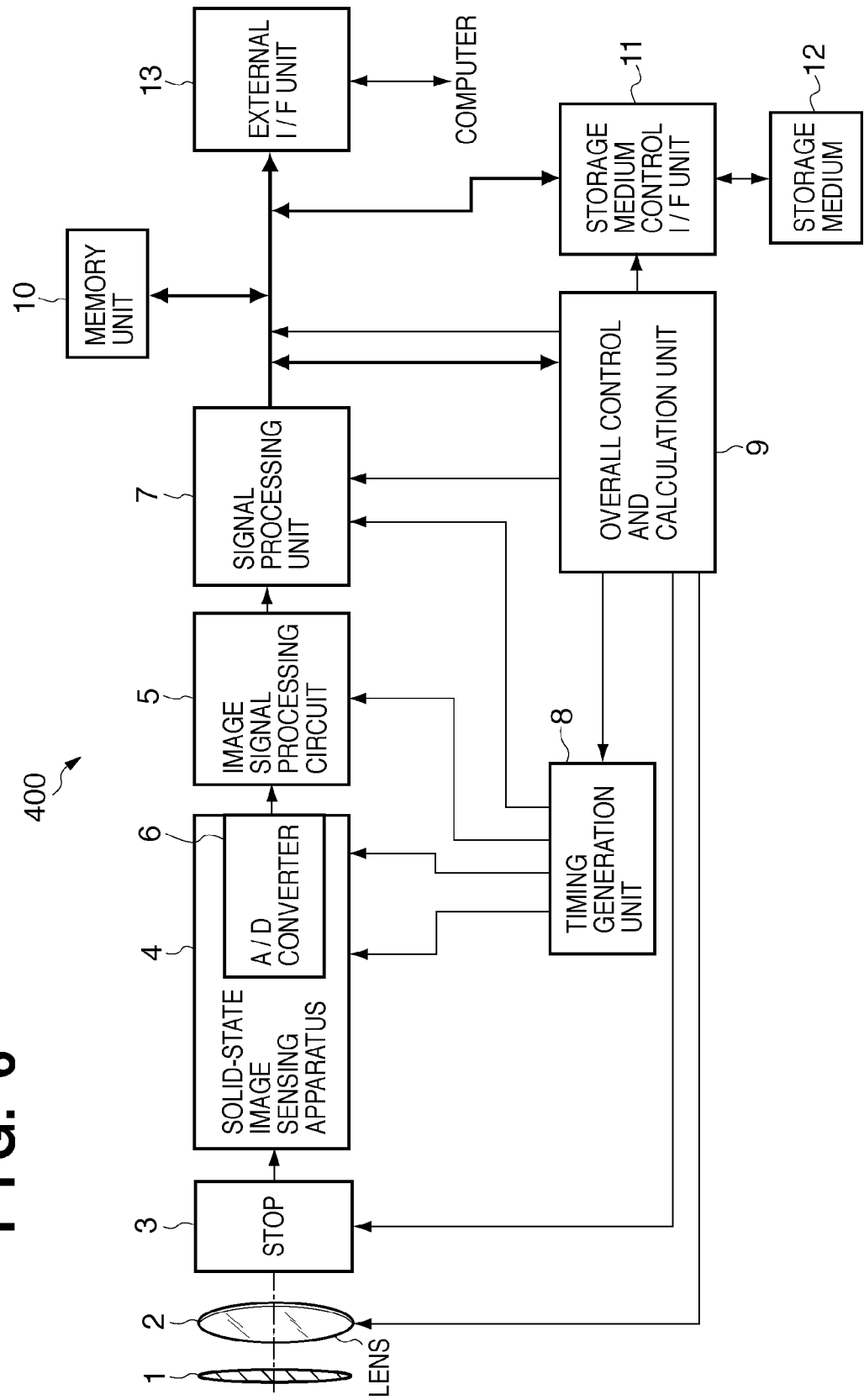

FIG. 6 is a block diagram showing an example of the arrangement of an image sensing system including the solid-state image sensing element 100 or 500 according to the embodiment.

DESCRIPTION OF THE EMBODIMENTS

Embodiments of the present invention will be described in detail hereinafter with reference to the accompanying drawings.

First Embodiment

Figure 1A:
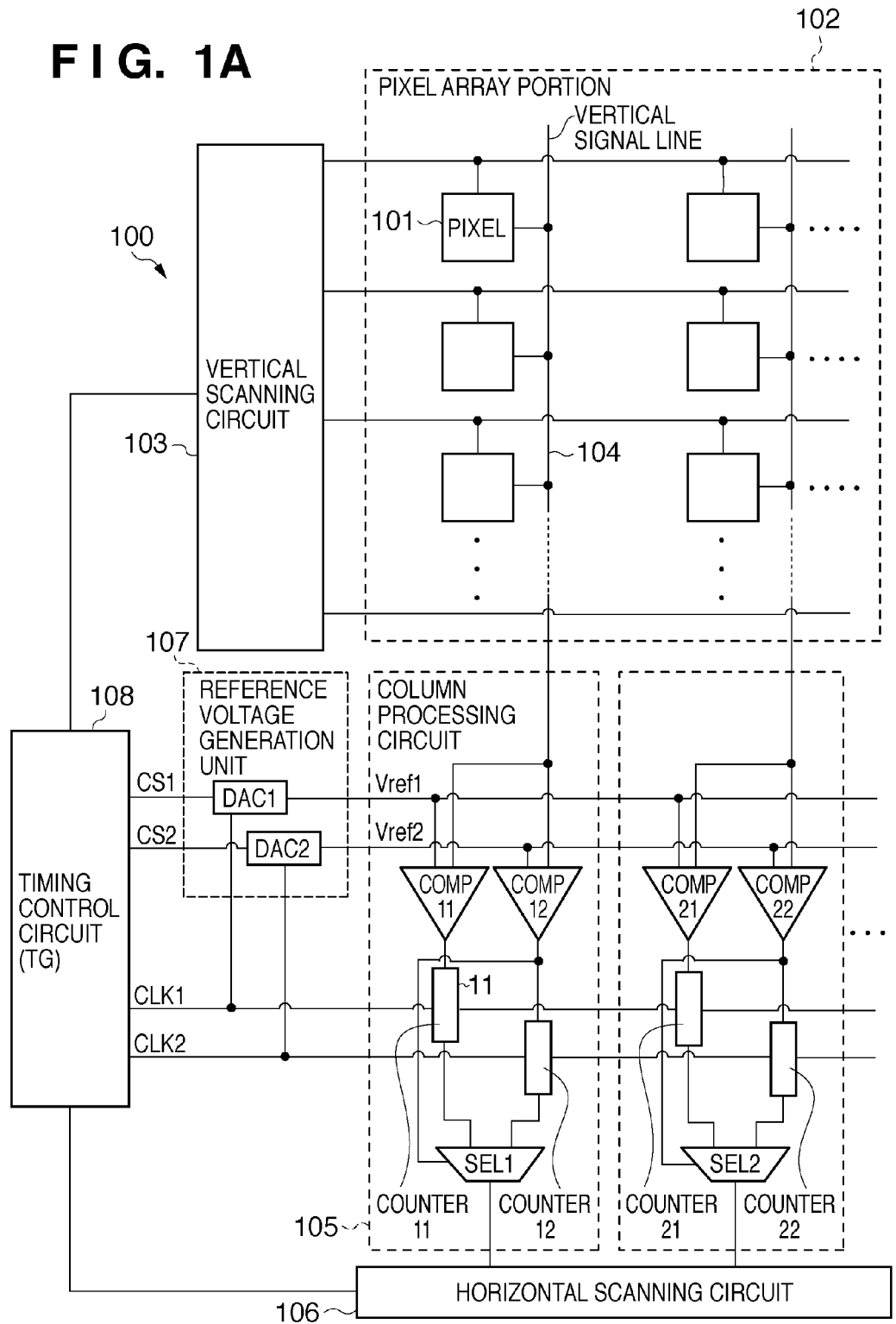
FIG. 1A is a schematic block diagram showing an example of the arrangement of a solid-state image sensing element 100 according to the first embodiment.

Arrangement Example of Solid-State Image Sensing Element of First Embodiment FIG. 1A is a block diagram showing an example of the arrangement of a solid-state image sensing element 100 according to the first embodiment of the present invention. The first embodiment will explain the arrangement in which an A/D conversion circuit has two signal comparators having different frequency bands. As shown in FIG. 1A, the solid-state image sensing element 100 includes a pixel array portion 102, vertical scanning circuit 103, vertical signal lines 104, column processing circuits 105, horizontal scanning circuit 106, reference voltage generation unit 107, and timing control circuit 108 (to be referred to as TG 108 hereinafter). The pixel array portion 102 includes a large number of pixels 101 which are arranged two-dimensionally. Each pixel 101 includes a photoelectric converter such as a photodiode, transfer transistor, reset transistor, amplifier transistor, and pixel selecting transistor, although these are not shown. In order to read out signals from pixels and to reset them in a row unit, pixels of one row are commonly connected to a control line from the vertical scanning circuit 103. Also, pixels of an identical column are connected to a common vertical signal line 104 required to read out a pixel signal Vsig.

The vertical scanning circuit 103 sequentially selects a pixel row so as to control a readout row and reset row. The scan timing is controlled by the TG 108. Normally, the vertical scanning circuit 103 performs reset scans in turn from the first pixel row, and then performs readout scans in turn from the first pixel row again after charge accumulation over a predetermined period. The aforementioned predetermined period is controlled upon reception of a signal from, for example, the TG 108, and is variable according to image sensing conditions such as a light amount of an object. The column processing circuits 105 are arranged in correspondence with respective columns of the pixel array portion 102, and serve as A/D conversion circuits which convert readout pixel signals Vsig on the vertical signal lines 104 into digital signals.

Processing Example of A/D Conversion of First Embodiment

Figure 2:
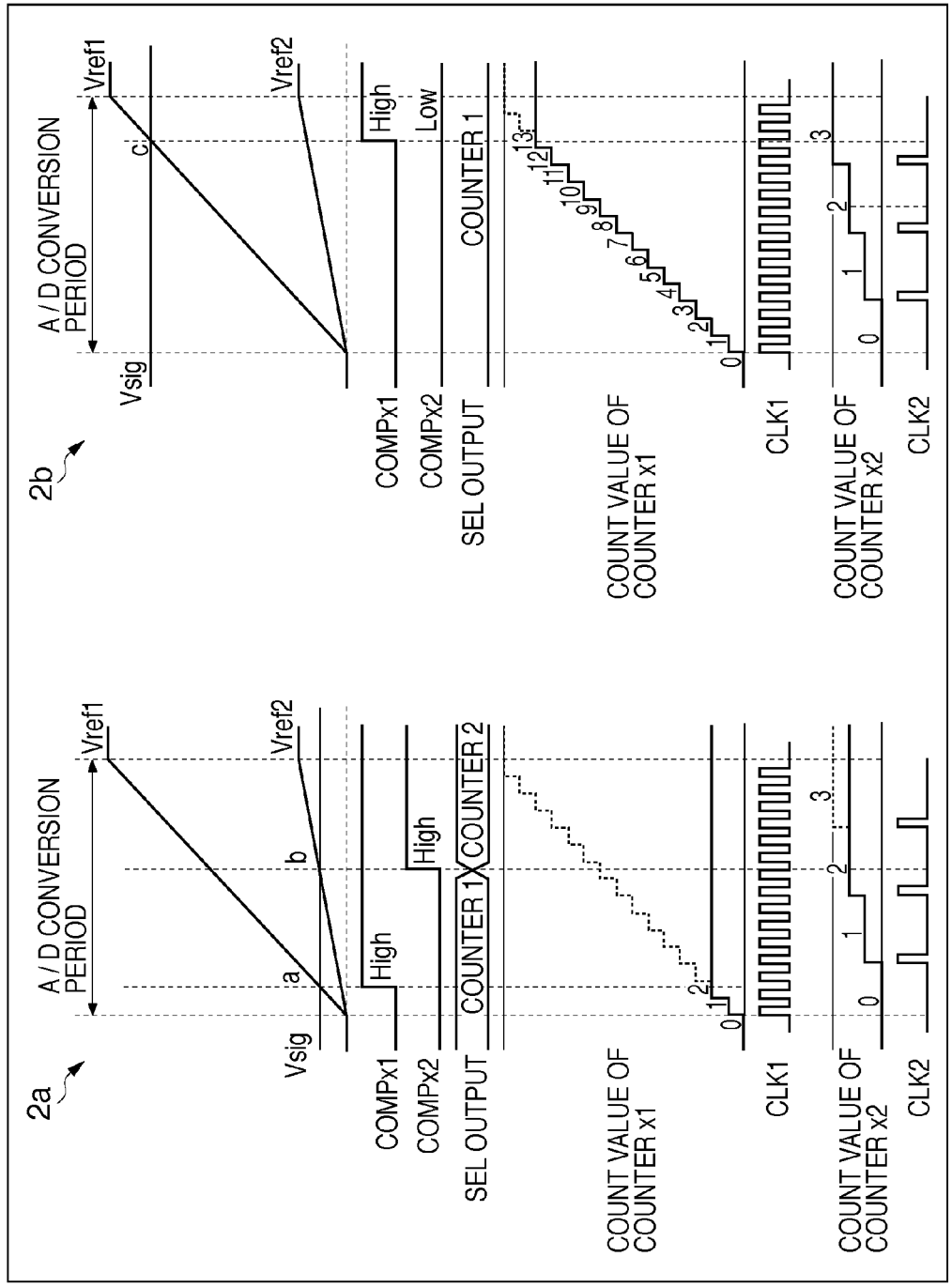
FIG. 2 shows explanatory charts 2a and 2b of A/D conversion operations in the solid-state image sensing element 100 according to the first embodiment, in which the charts 2a show A/D conversion operations when a pixel signal level in the solid-state image sensing element 100 according to the first embodiment is relatively low, and the charts 2b show A/D conversion operations when a pixel signal level is relatively high.

An analog-to-digital conversion (A/D conversion) system is single-slope integration type A/D conversion in this embodiment. This A/D conversion operation will be described below using charts 2a and 2b in FIG. 2. The charts 2a in FIG. 2 show a case in which the pixel signal Vsig is relatively small. The charts 2b in FIG. 2 show a case in which the pixel signal Vsig is relatively large. Note that an A/D conversion speed is decided by an A/D conversion period. This A/D conversion period is decided to satisfy a required A/D conversion speed and readout speed.

(When Pixel Signal Vsig is Relatively Small)

Reference voltage levels Vref1 and Vref2, which temporally change in the charts 2a in FIG. 2, are reference voltages, which are generated by the reference voltage generation unit 107 in FIG. 1A, and change in a slope shape. The reference voltage generation unit 107 is controlled by clocks CLK1 and CLK2 and control signals CS1 and CS2 from the TG 108. The reference voltages Vref1 and Vref2 to be generated have different voltage change slopes with respect to the time axis. In this embodiment, the slope of the voltage Vref1 is four times that of the voltage Vref2. Since the pixel signal Vsig has a relatively small signal voltage level, it intersects with the voltage Vref1 at a point a in the charts 2a in FIG. 2 and the voltage Vref2 at a point b in the charts 2a in FIG. 2 during the A/D conversion period. COMPx1 and COMPx2 ("x" indicates a column number; the same applies to the following description) represent comparison circuits included in each column processing circuit of each column. The comparison circuit COMPx1 compares signal levels of the voltage Vref1 and the pixel signal Vsig, and the comparison circuit COMPx2 compares those of the voltage Vref2 and the pixel signal Vsig. Both the comparison circuits output High signals when the reference voltages Vref exceed the pixel signal Vsig. In the charts 2a in FIG. 2, the output from the comparison circuit COMPx1 changes to High at the point a, and that from the comparison circuit COMPx2 changes to High at the point b.

Frequency Band Example of Comparison Circuit

Figure 3:
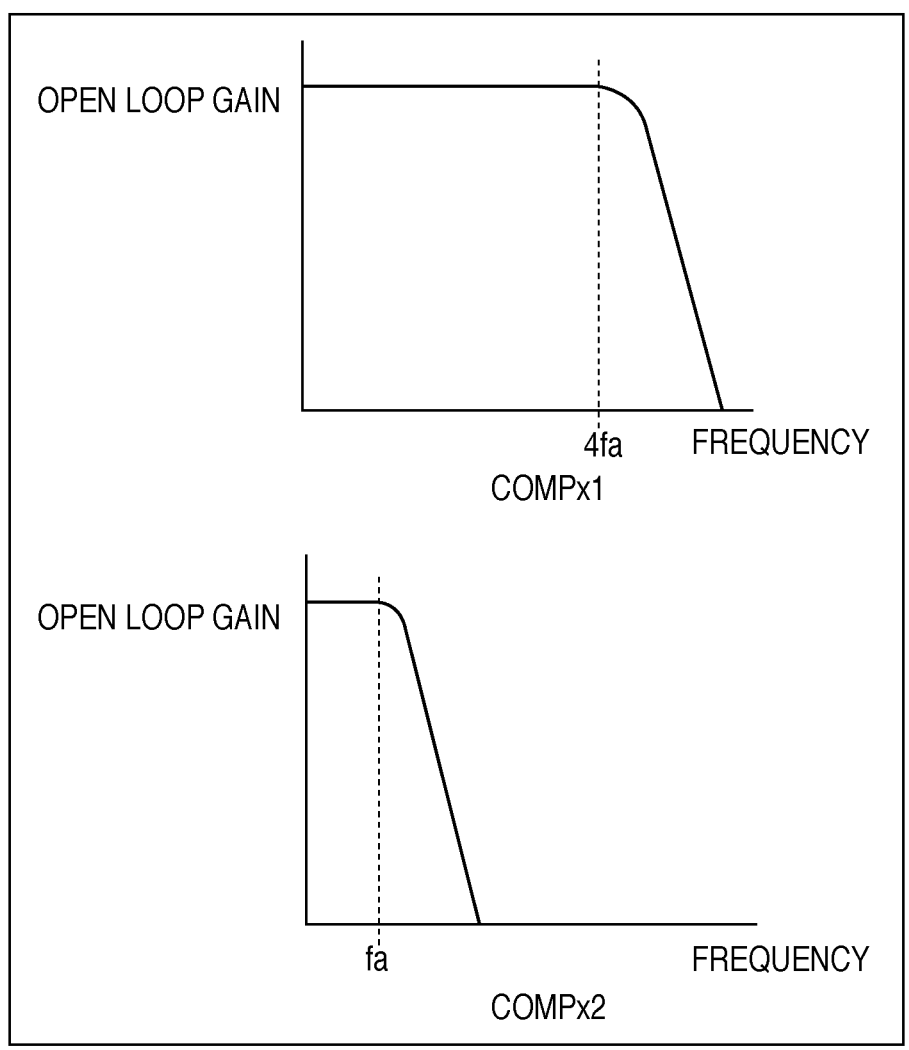
FIG. 3 shows graphs for explaining a difference between frequency bands of the comparison circuits COMPx1 and COMPx2.

A characteristic feature of the first embodiment lies in that comparison circuits COMPx1 and COMPx2 have different frequency bands. The outline is expressed by graphs COMPx1 and COMPx2 in FIG. 3. In the first embodiment, assume that the comparison circuit COMPx1 has a band four times broader than that of the comparison circuit COMPx2. In practice, these frequency bands are set by different circuit drive currents. The setting method is as follows. The internal arrangement of the comparison circuit can be expressed by an equivalent circuit using a current source, resistor, capacitor, or the like, and a signal is transmitted through this equivalent circuit as charging/discharging of a charge. In this circuit, since decreasing a drive current is equivalent to reducing a charge amount that can be moved within a certain time period, a time required for charging/discharging for signal transmission is prolonged. Since the frequency band is a reciprocal of the signal transmission time, a narrow frequency band is set in this case. Conversely, by increasing a drive current, a frequency band can be broadened. Note that a frequency band can be changed by simply setting an arbitrary drive current, for the sake of simplicity. However, in practice, a balance with various tradeoffs such as a circuit area and heat generation has to be taken into consideration, and related design details require attention. As another method, different capacitance values used to charge/discharge a charge may be set. If a capacitance is large even when the drive current remains the same, an extra time is required for charging/discharging, thus narrowing down the frequency band. Note that the method of setting different frequency bands is not limited to the aforementioned two methods. In this example, the frequency bands are also distinguished by describing a narrow frequency band as a first frequency band characteristic and a broad frequency band as a second frequency band characteristic.

(Example of COMPx1 and COMPx2)

FIG. 1B shows the circuit arrangement of the comparison circuits COMPx1 and COMPx2. Each of the comparison circuits COMPx1 and COMPx2 includes a switch SW1 used to switch inputs, a clamp capacitor Cin, an inverter INV, a switch SW2 used to short-circuit the input and output of the inverter INV, and a load capacitor CL. Furthermore, the inverter INV includes a P-type MOS transistor M1 and N-type MOS transistor M2.

The operations in case of the comparison circuits COMPx1 and COMPx2 are as follows. The switch SW1 is connected to the Vin side, and the switch SW2 is short-circuited. Since the input and output of the inverter INV are short-circuited by the switch SW2, the input and output voltages of the inverter INV are balanced to a threshold voltage Vx. At this time, the capacitor Cin holds a charge Q corresponding to a voltage difference between the voltages Vin and Vx. Next, the switch SW1 is connected to the Vref1 side, and the switch SW2 is opened. While the voltage Vref is lower than the voltage Vin, a voltage lower than the voltage Vx is input to the input of the inverter INV via the capacitor Cin, and the output of the inverter INV changes to High. When the voltage Vref1 gradually increases, and exceeds the voltage Vin, the input of the inverter INV exceeds the voltage Vx, and the output of the inverter INV is also inverted to Low. At this time, a driving frequency of the inverter INV is decided by a conductance gm of the transistors M1 and M2 and the load capacitor CL. The conductance gm indicates how easily a current flows, and the driving frequency upon charging/discharging the load capacitor CL via the transistor M1 or M2 can be obtained by calculating gm/CL (Hz). That is, the driving frequency becomes higher with increasing gm, or becomes lower with decreasing gm. Furthermore, when the MOS is driven in a saturated region, the conductance gm can be given by gm=μ×Cox×W/L×(Vgs−Vth), where μ is a mobility of a charged particle, Cox is a MOS capacitance per unit length, W is a gate width of the MOS, L is a gate length of the MOS, Vgs is a gate-source voltage, and Vth is a threshold voltage of the MOS. That is, the driving frequency of the inverter INV can be changed according to a ratio W/L.

The comparison circuits COMPx1 and COMPx2 have different frequencies using the aforementioned characteristics. In the comparison circuit COMPx2, since the ratio W/L is set to be smaller than that in the comparison circuit COMPx1, a narrow frequency band is set. Note that the circuit arrangement that changes the frequency band is not limited to the aforementioned example.

COUNTERx1 and COUNTERx2 ("x" indicates a column number; the same applies to the following description) represent counter circuits included in each column processing circuit of each column. COUNTERx1 and COUNTERx2 start count-up operations in response to the clocks CLK1 and CLK2 from the TG 108 simultaneously when the voltages Vref1 and Vref2 change in a slope shape during the A/D conversion period. The COUNTERx1 and COUNTERx2 end the count-up operations when the outputs of the corresponding comparison circuits COMP change to High. In the single-slope integration type A/D conversion, this count value indicates a digital conversion result of the pixel signal Vsig.

In the charts 2a in FIG. 2, the COUNTERx1 ends the count-up operation at the point a. If the output from the comparison circuit COMPx1 does not change to High, the COUNTERx1 counts up from 0 to 15 during the A/D conversion period, as indicated by the stepwise dotted line. The same applies to the COUNTERx2. That is, the COUNTERx2 ends the count-up operation at the point b. If the output from the comparison circuit COMPx2 does not change to High, the COUNTERx2 counts up, as indicated by the stepwise dotted line. Note that the clock CLK2 supplied to the COUNTERx2 has a cycle ¼ or less of that of the clock CLK1. This is because since the frequency band of the comparison circuit COMPx2 is set to be ¼ that of the comparison circuit COMPx1, as described above, the clock CLK2 has to be set at a low speed ¼ or less with respect to the comparison circuit COMPx1 to fall within the frequency band of the comparison circuit COMPx2. That is, since the clock CLK2 is set at a low speed, the frequency band of the comparison circuit COMPx2 can be limited accordingly. In the following description of this embodiment, the clock CLK2 has a cycle ¼ that of the clock CLK1. Since the comparison circuit COMPx2 has a narrow frequency band, a change in reference voltage Vref2 is slowed to ¼ that in reference voltage Vref1. In the present invention, the A/D conversion period is decided to have a certain time period so as to attain high-speed A/D conversion. At this time, in the comparison circuit COMPx2, a signal level that allows comparison between the reference voltage Vref2 and pixel signal Vsig is narrowed down to ¼. In this case, the comparison circuit COMPx1 performs comparison operations of 16 tones ranging from 0 to 15, while the comparison circuit COMPx2 is limited to four tones ranging from 0 to 3. However, the tone width (resolution) of the comparison circuit COMPx1 is the same as that of the comparison circuit COMPx2. Hence, when viewed from the final output, the A/D conversion resolution remains unchanged. In this example, the comparison circuit COMPx1 has 16 tones, that is, 4-bit resolution. However, in actual A/D conversion, in case of 14-bit resolution, a comparison circuit has $2^{14}$ tones. By setting a narrow frequency band of the comparison circuit COMPx2, merits are expected in terms of noise. The charts 2a in FIG. 2 have ideal expressions in which the comparison circuits COMPx1 and COMPx2 are free from any influences of noise. As described above, since the comparison circuits COMPx1 and COMPx2 are set to have the same resolution, the values of the COUNTERx1 and COUNTERx2 are both "2" when the outputs of the corresponding comparison circuits change to High, that is, ideal digital conversion values of the signal Vsig.

However, an actual comparison circuit COMP suffers noise components. For this reason, a digital conversion value, which is supposed to be "2", may often be "1" or "3" due to noise. Especially, when the required A/D conversion resolution is high and a quantization error is reduced, the influence of noise is directly observed in the digital conversion result. Since the frequency band of the comparison circuit COMPx2 is limited to a narrow band, noise components greater than or equal to a cutoff frequency can be removed. That is, in the comparison circuit COMPx2, a signal level range that allows A/D conversion is narrowed down, but a low-noise signal readout operation is allowed within that signal level range. As one characteristic feature of this embodiment, a pixel signal level that may pose a noise problem is A/D-converted within the signal level range that allows A/D conversion in the comparison circuit COMPx2.

Assuming that the frequency band of the comparison circuit COMPx2 is ¼ that of the comparison circuit COMPx1, and the clock CLK2 is driven at a speed ¼ or less that of the CLK1, for example, at a ⅕ speed, a change in reference voltage Vref is also set to be ⅕. In this case, the signal level that can be A/D-converted within the predetermined time period is reduced from ¼ described above to ⅕. However, the frequency band of the comparison circuit COMPx2 remains unchanged from ¼ in terms of noise. That is, when the ratio of the frequency bands of the comparison circuits COMPx1 and COMPx2 is equal to that of the clocks CLK1 and CLK2, a signal level that can be A/D-converted within the predetermined time period is maximized. Note that the predetermined time period can be arbitrarily decided according to conditions such as an object luminance.

A selector SELx in FIG. 1A finally decides which of the A/D conversion results, that is, signals digitally converted by the comparison circuits COMPx1 and COMPx2 is to be read out. The output signal from the comparison circuit COMPx2 is supplied to a select switch of the selector SELx. When the output from the comparison circuit COMPx2 is High, the digital conversion data by the comparison circuit COMPx2 is read out; when the output is Low, the conversion data of the comparison circuit COMPx1 is read out. Hence, when the pixel signal Vsig is less than or equal to a maximum value of the voltage Vref2, as in the case of the charts 2a in FIG. 2, a count value on the COMPx2 side is used as a digital signal. A digital signal selected by the selector SELx is finally sequentially read out in the horizontal direction by the horizontal scanning circuit 106 in FIG. 1A.

(When Pixel Signal Vsig is Relatively Large)

The operations when the voltage level of the pixel signal Vsig is larger than the maximum value (threshold level) of the voltage Vref2 will be described below using the charts 2b in FIG. 2. As shown in the charts 2b in FIG. 2, the pixel signal Vsig intersects with the voltage Vref1 at a point c in the charts 2b in FIG. 2, and does not intersect with the voltage Vref2 during the A/D conversion period. As a result, the COUNTERx1 stops the count-up operation at a count value "13" when the output of the comparison circuit COMPx1 changes to High, but the COUNTERx2 continues a count-up operation since the output of the comparison circuit COMPx2 does not change. Since the output of the comparison circuit COMPx2 does not change, the selector SELx selects the output from the comparison circuit COMPx1, and the count value on the COMPx1 side is finally sequentially read out in the horizontal direction via the horizontal scanning circuit 106. When the pixel signal is larger than the maximum value of the voltage Vref2, the signal is read out from the comparison circuit COMPx1 which includes a relatively large amount of noise. In most cases, noise in this case does not pose a serious problem. This is because when the pixel signal level becomes large to a certain level, light-shot noise different from noise generated by the circuit becomes a noise dominant factor. The light-shot noise is noise proportional to a square of a light amount, and is caused by a principle of physics. At a signal level at which this noise exceeds circuit noise, it is substantially insignificant to reduce the circuit noise. Hence, in a signal level region in which light-shot noise is a principal factor, the A/D conversion by the comparison circuit COMPx1, which takes precedence of high-speed signal comparison over a circuit noise reduction, is executed.

Effect of First Embodiment

As described above, the first embodiment adopts the arrangement in which the solid-state image sensing element 100 includes the plurality of comparison circuits having different frequency band characteristics in the comparison unit used in the A/D conversion, and these comparison circuits are selectively applied according to the signal level of the pixel signal Vsig. According to this arrangement, when a signal level which is practically influenced by circuit noise is low, the A/D conversion with less circuit noise is executed; when the signal level is high, the A/D conversion including high-speed signal comparison is executed. Therefore, the solid-state image sensing element which can output a high-precision digital signal at high speed can be provided.

Second Embodiment

Arrangement Example of Solid-State Image Sensing Element of Second Embodiment

Figure 4:
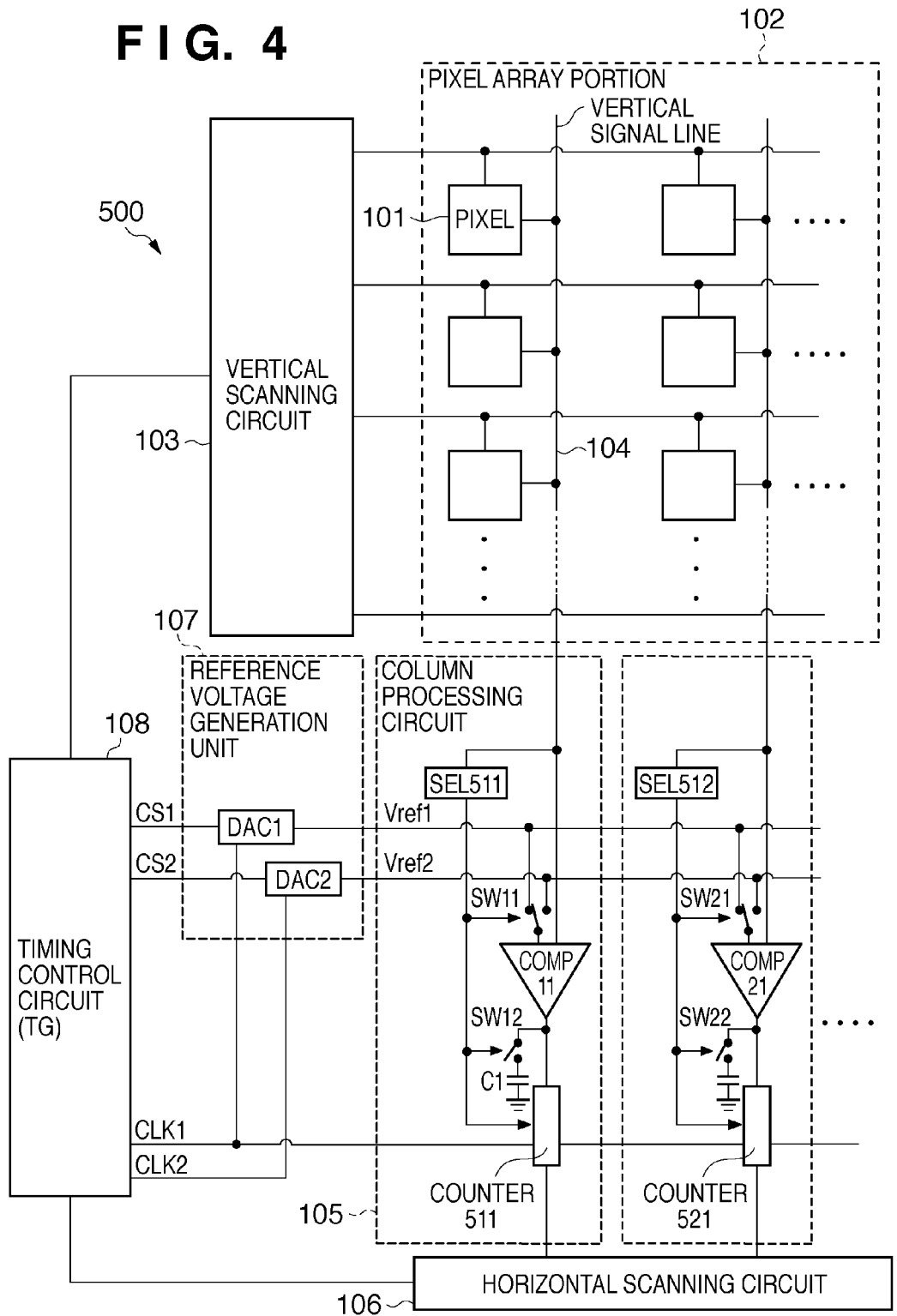
FIG. 4 is a schematic block diagram showing an example of the arrangement of a solid-state image sensing element 500 according to the second embodiment.

FIG. 4 is a block diagram showing an example of the arrangement of a solid-state image sensing element 500 according to the second embodiment of the present invention. In FIG. 4, the same reference numerals denote portions equivalent to those in FIG. 1A. This embodiment will describe an arrangement in which an A/D conversion circuit includes one signal comparator which is used by switching its frequency band. In FIG. 4, a selector SEL5x1, switches SWx1 and SWx2, capacitor C1, and COUNTER5x1 are added to the arrangement shown in FIG. 1A. The selector SEL5x1 is an A/D selection circuit, which selects whether to execute A/D conversion which can attain high-speed signal comparison but includes relatively large noise or that which performs low-speed signal comparison and includes less noise. This circuit compares a signal level of a pixel signal Vsig with a reference voltage (a maximum value of a reference voltage Vref), and outputs High when the signal level is larger than the maximum value or Low when the signal level is smaller than the maximum value. A comparison circuit (not shown) is used for comparison with the reference voltage. However, the precision required for the comparison circuit used in this case is not so high compared to that of the aforementioned comparison circuits COMPx1 and COMPx2. When the signal level of the pixel signal Vsig is larger than that of the reference voltage, at least the selector need only be switched to perform high-speed A/D conversion with relatively large noise. This is because even when a pixel signal level used to select A/D conversion varies and becomes circuit noise, since it is sufficiently smaller than light-shot noise as a noise dominant factor, the same noise result is obtained independently of the selected A/D conversion.

The switch SWx1 is a switch circuit which selects a reference voltage Vref1 to be compared by a comparison circuit COMPx1 when the output of the selector SEL5x1 is High, or a reference voltage Vref2 when the output is Low. As in the first embodiment, at the voltage Vref1, an operation which allows A/D conversion that includes slightly large noise but can attain high-speed signal comparison is selected, and at the voltage Vref2, an operation which allows A/D conversion that attains low-speed signal comparison and includes less noise is selected. The switch SWx2 is a switch circuit which disconnects the capacitor C1 from the output terminal of the comparison circuit COMPx1 when the output of the selector SEL5x1 is High, or connects the capacitor C1 when the output is Low. When the capacitor C1 is disconnected, since the frequency band of the comparison circuit COMPx1 is that of the circuit itself, a high-speed comparison operation, which includes slightly large noise but can trace a quick change in reference voltage, can be attained, thus allowing high-resolution A/D conversion. On the other hand, when the capacitor C1 is connected to the output terminal, since the capacitive load of the capacitor C1 acts to limit the frequency band of the comparison circuit COMPx1, a low-speed comparison operation is performed. However, low-noise A/D conversion can be attained. The COUNTER5x1 changes bit selection upon outputting a count value as a digital signal by logic calculations in the selector SEL5x1. When the output of the selector SEL5x1 is High, a count value of the COUNTER5x1 is output intact; when it is Low, the lower 2 bits of the output of the COUNTER5x1 are ignored, and the lower 3rd bit is output as a least significant bit of the output count value. That is, when the output of the selector SEL5x1 is Low, a bit shift operation of 2 bits is executed. Therefore, when the output of the selector SEL5x1 is Low, a count-up operation is made once per four counts of the COUNTER5x1.

Processing Example of A/D Conversion of Second Embodiment

Figure 5:
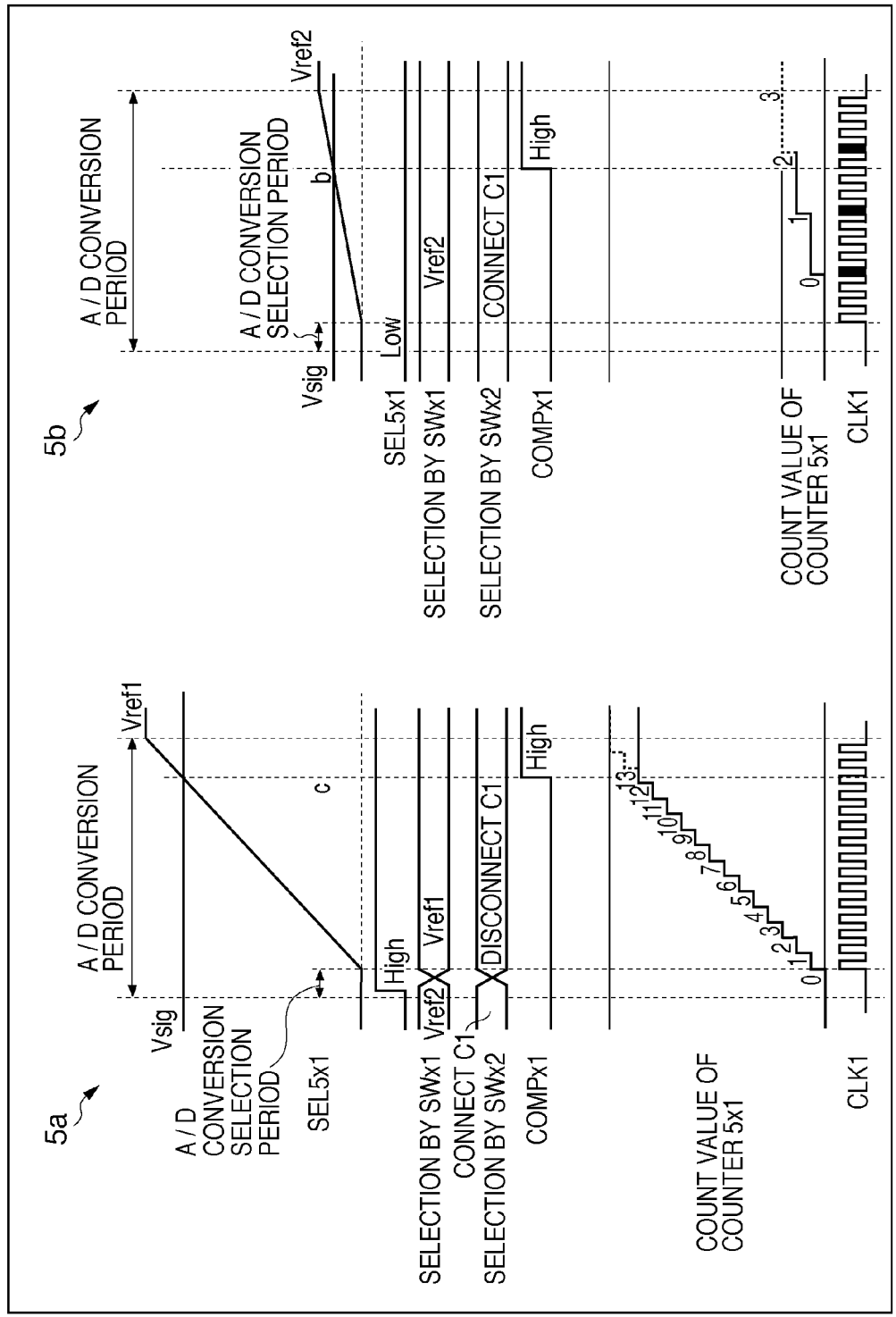
FIG. 5 shows explanatory charts 5a and 5b of A/D conversion operations in the solid-state image sensing element 500 according to the second embodiment, in which the charts 5a show A/D conversion operations when a pixel signal level in the solid-state image sensing element 500 according to the second embodiment is relatively high, and the charts 5b show A/D conversion operations when a pixel signal level is relatively low.

Charts 5a and 5b in FIG. 5 explain the A/D conversion operations of the solid-state image sensing element 500.

(When Pixel Signal Vsig is Relatively Large)

The charts 5a in FIG. 5 show a case in which the voltage level of the pixel signal Vsig is higher than a maximum value (threshold level) of the voltage Vref2. In the solid-state image sensing element 500, an A/D conversion selection period is assured before the reference voltage begins to be changed in a ramp-wave shape, and the selector SEL5x1 selects A/D conversion during this period. In the charts 5a in FIG. 5, since the pixel signal Vsig is larger than the maximum value of the reference voltage Vref2 of the selector SEL5x1, the output of the selector SEL5x1 changes to High. In response to the output of the selector SEL5x1, the reference voltage Vref1 is selected, and the capacitor C1 is disconnected. The COUNTER5x1 counts up one count in response to each clock, and stops the count-up operation when the output from the comparison circuit COMPx1 is switched to High. The count value of the COUNTER5x1 is set to be output without being bit-shifted. In this manner, when the level of the pixel signal Vsig is higher than the maximum value of the voltage Vref2, high-resolution A/D conversion which includes slightly large noise but can perform a high-speed comparison operation is executed.

(When Pixel Signal Vsig is Relatively Small)

On the other hand, the charts 5b in FIG. 5 show a case in which the voltage level of the pixel signal Vsig is lower than the maximum value (threshold level) of the voltage Vref2. As in the charts 5a in FIG. 5, the A/D conversion selection period is assured, and the aforementioned selector SEL5x1 selects A/D conversion during this period. In the charts 5b in FIG. 5, since the pixel signal Vsig is less than or equal to the reference voltage of the selector SEL5x1, the output of the selector SEL5x1 remains Low. As a result, the reference voltage Vref2 is selected, and the capacitor C1 is connected to act to limit the frequency band of the comparison circuit COMPx1. The COUNTER5x1 counts up one count in response to each clock, and stops the count-up operation when the output of the comparison circuit COMPx1 changes to High. However, the count value of the COUNTER5x1 undergoes a bit shift operation which ignores the lower 2 bits of the count value of the COUNTER5x1 and outputs the lower 3rd bit as the least significant bit, thus outputting a value ¼ of the count value. In this case, A/D conversion which performs a low-speed comparison operation but includes less noise is executed.

Note that as another control method of the COUNTER5x1, a clock CLK2 may also be input to the COUNTER5x1 in addition to the clock CLK1, and connection of the clocks CLK1 and CLK2 may be switched by logic calculations of the selector SEL5x1. More specifically, when the output of the selector SEL5x1 is High, the COUNTER5x1 may perform a count-up operation in response to the clock CLK1; when the output of the selector SEL5x1 is Low, it may perform a count-up operation in response to the clock CLK2. A merit of this arrangement is to obviate the need for the bit shift operation independently of the output of the selector SEL5x1.

Effect of Second Embodiment

As described above, according to the second embodiment, the solid-state image sensing element 500 adopts the arrangement in which the frequency band characteristic of the comparison circuit COMPx1 used in A/D conversion, the reference voltages, and the operations of other peripheral circuits can be easily switched based on the output level of the pixel signal Vsig. According to this arrangement, when a signal level which is practically influenced by circuit noise is low, the A/D conversion with less circuit noise is executed; when the signal level is large to some extent, the A/D conversion including high-speed signal comparison is executed. Therefore, the solid-state image sensing element which can output a high-precision digital signal at high speed can be provided.

Arrangement Example of Image Sensing System of this Embodiment

The solid-state image sensing elements of the first and second embodiments can be used as an image sensing element of a digital camera, digital video camera, industrial camera, and the like. Using the present invention, an image sensing operation which allows a high-speed readout operation, and improves noise in a low light amount portion (low signal level) in which the influence of circuit noise appears dominantly can be attained.

FIG. 6 is a schematic block diagram showing the arrangement of an image sensing system including the solid-state image sensing element according to the first and second embodiments. An image sensing system 400 includes a solid-state image sensing apparatus 4 represented by the solid-state image sensing element 100 or 500 according to the first or second embodiment. Note that in this embodiment, the solid-state image sensing apparatus 4 includes an A/D converter 6.

An optical image of an object is formed on an image sensing surface of the solid-state image sensing apparatus 4 by a lens 2. A barrier 1, which serves as both a protect function of the lens 2 and a main switch, can be arranged outside the lens 2. Behind the lens 2, a stop 3 used to adjust the amount of light emerging from the lens 2 can be arranged. Image signals, which are output from the solid-state image sensing apparatus 4 in a plurality of channels and are converted into digital signals by the A/D converter 6, undergo processing including various corrections and clamping by an image signal processing circuit 5. Image data output in a plurality of channels from the image signal processing circuit 5 undergo various corrections, data compression, and the like by a signal processing unit 7. The solid-state image sensing apparatus 4, A/D converter 6, image signal processing circuit 5, and signal processing unit 7 operate according to timing signals generated by a timing generation unit 8. The blocks 5 to 8 may be formed on the same chip as that of the solid-state image sensing apparatus 4. The respective blocks of the image sensing system 400 are controlled by an overall control and calculation unit 9. In addition, the image sensing system 400 includes a memory unit 10 used to temporarily store image data, and a storage medium control interface unit 11 used to record or read out an image in or from a storage medium. A storage medium 12 includes, for example, a semiconductor memory, and is detachable. The image sensing system 400 may include an external interface (I/F) unit 13 used to communicate with, for example, an external computer.

The operation of the image sensing system 400 shown in FIG. 6 will be described below. In response to an opening action of the barrier 1, a main power supply, a power supply of a control system, and that of an image sensing system circuit including the A/D converter 6 are turned on in turn. After that, in order to control an exposure amount, the overall control and calculation unit 9 controls the stop 3 to open. Signals output from the solid-state image sensing apparatus 4 via the A/D converter 6 are output to the signal processing unit 7 through the image signal processing circuit 5. The signal processing unit 7 processes the input data, and provides the processed data to the overall control and calculation unit 9. The overall control and calculation unit 9 makes calculations to decide an exposure amount. The overall control and calculation unit 9 controls the stop based on the decided exposure amount. Then, the overall control and calculation unit 9 extracts high-frequency components from signals which are output from the solid-state image sensing apparatus 4 and are processed by the signal processing unit 7, and calculates a distance to an object based on the high-frequency components. After that, the overall control and calculation unit 9 drives the lens 2 to check if an in-focus state is attained. If it is determined that an in-focus state is not attained, the overall control and calculation unit 9 drives the lens 2 again to calculate the distance. After the in-focus state is confirmed, a main exposure operation starts. Upon completion of the exposure operation, image signals, which are output from the solid-state image sensing apparatus 4 and are A/D-converted by the A/D converter 6, undergo, for example, corrections by the image signal processing circuit 5, and are processed by the signal processing unit 7. Image data processed by the signal processing unit 7 are stored in the memory unit 10 under the control of the overall control and calculation unit 9. After that, the image data stored in the memory unit 10 are recorded in the storage medium 12 via the storage medium control I/F unit under the control of the overall control and calculation unit 9. Alternatively, the image data may be provided to and processed by a computer via the external I/F unit 13.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-187834, filed on Aug. 13, 2009, which is hereby incorporated by reference herein in its entirety.

What is claimed is:

1. A solid-state image sensing element comprising:
   a pixel array portion in which a plurality of pixels each including a photoelectric converter are arranged two-dimensionally;
   a reference level generation unit configured to generate a temporally changing reference level;
   a plurality of readout circuits configured to read out analog pixel signals from the pixel array portion, each of the readout circuits including an A/D conversion circuit which converts an analog pixel signal from a corresponding column of the pixel array portion into a digital pixel signal, each A/D conversion circuit performing A/D conversion by comparing, with a comparison unit, a signal level of the analog pixel signal from the corresponding column of the pixel array portion with the temporally changing reference level;
   a capacitance corresponding to the respective column of the pixel array; and
   a control unit configured to connect the corresponding capacitance to the output of the comparison unit in accordance with the signal level of the analog pixel signal from the pixel array portion,
   wherein the control unit, when the signal level of the analog pixel signal from the pixel array portion is lower than a threshold level, causes the comparison unit to perform comparison with a first capacitance value of the capacitance, and, when the signal level of the analog pixel signal from the pixel array portion is higher than the threshold level, causes the comparison unit to perform comparison with a second capacitance value of the capacitance smaller than the first capacitance value.

2. The element according to claim 1, wherein the A/D conversion circuit includes a counter configured to count clocks during an interval in which the signal level of the analog pixel signal from the pixel array portion exceeds the temporally changing reference level, and to output a count value of clocks as a digital pixel signal.

3. An image sensing system comprising:
   a solid-state image sensing element according to claim 1; and
   a signal processing unit configured to process a signal obtained by the solid-state image sensing element.

4. The element according to claim 1, wherein the change rates of the temporally changing reference levels input to each of the plurality of comparison units are changed in accordance with the signal level of the analog pixel signal from the pixel array portion.

5. A solid-state image sensing element comprising:
   a pixel array portion in which a plurality of pixels each including a photoelectric converter are arranged two-dimensionally;
   a reference level generation unit configured to generate a temporally changing reference level;
   a plurality of readout circuits configured to read out analog pixel signals from the pixel array portion, each of the readout circuits including an A/D conversion circuit which converts an analog pixel signal from a corresponding column of the pixel array portion into a digital pixel signal, each A/D conversion circuit performing A/D conversion by comparing, with a comparison unit, a signal level of the analog pixel signal from the corresponding column of the pixel array portion with the temporally changing reference level; and
   a control unit, wherein
   each of the A/D conversion circuits include a plurality of comparison units each of which drives a corresponding capacitance with capacitance values that are different from each other, and
   the control unit selects one of the plurality of comparison units in accordance with the signal level of the analog pixel signal from the pixel array portion.

* * * * *